(12) United States Patent
Kroll et al.

(10) Patent No.: US 7,344,909 B2
(45) Date of Patent: Mar. 18, 2008

(54) METHOD FOR PRODUCING SEMI-CONDUCTING DEVICES AND DEVICES OBTAINED WITH THIS METHOD

(75) Inventors: Ulrich Kroll, Corcelles (CH); Cédric Bucher, Montet-Cudrefin (CH); Jacques Schmitt, Va Ville du Bois (FR); Markus Poppeller, Feldkirch (AT); Christoph Hollenstein, Lutry (CH); Juliette Ballutaud, Lausanne (CH); Alan Howling, Cugy (CH)

(73) Assignee: OC Oerlikon Balzers AG, Balzers (LI)

( * ) Notice: Subject to any disclaimer, the term of this patent is extended or adjusted under 35 U.S.C. 154(b) by 444 days.

(21) Appl. No.: 10/691,102

(22) Filed: Oct. 22, 2003

(65) Prior Publication Data

US 2004/0135221 A1 Jul. 15, 2004

Related U.S. Application Data

(60) Provisional application No. 60/476,670, filed on Jun. 6, 2003, provisional application No. 60/439,764, filed on Jan. 13, 2003, provisional application No. 60/421,171, filed on Oct. 25, 2002.

(51) Int. Cl.
*H01L 21/20* (2006.01)

(52) U.S. Cl. ............... 438/57; 438/96; 438/97; 438/495; 257/E21.106

(58) Field of Classification Search ............ 438/96–97, 438/479–509; 134/1.2, 1.3; 136/255–256
See application file for complete search history.

(56) References Cited

U.S. PATENT DOCUMENTS

| | | | | |
|---|---|---|---|---|
| 4,398,054 A | * | 8/1983 | Madan | 136/255 |
| 4,547,621 A | * | 10/1985 | Hack et al. | 136/249 |
| 4,845,043 A | * | 7/1989 | Catalano | 438/93 |
| 5,032,884 A | * | 7/1991 | Yamagishi et al. | 257/458 |
| 5,256,887 A | * | 10/1993 | Yang | 257/53 |
| 5,512,102 A | * | 4/1996 | Yamazaki | 118/723 MW |
| 5,563,425 A | * | 10/1996 | Saito et al. | 257/53 |
| 5,728,629 A | | 3/1998 | Mizuno et al. | |
| 6,020,035 A | | 2/2000 | Gupta et al. | |
| 6,124,545 A | * | 9/2000 | Bauer et al. | 136/255 |
| 6,204,192 B1 | * | 3/2001 | Zhao et al. | 438/723 |
| 6,261,862 B1 | * | 7/2001 | Hori et al. | 438/96 |
| 6,352,942 B1 | | 3/2002 | Luan et al. | |
| 6,479,373 B2 | | 11/2002 | Dreybrodt et al. | |
| 6,653,165 B2 | * | 11/2003 | Kondo et al. | 438/73 |
| 6,821,572 B2 | * | 11/2004 | Moon et al. | 427/535 |
| 2004/0168705 A1 | * | 9/2004 | Sun et al. | 134/1.2 |

FOREIGN PATENT DOCUMENTS

| | | | |
|---|---|---|---|
| EP | 0 661 731 | | 7/1995 |
| EP | 0 844 649 | | 5/1998 |
| EP | 0 865 074 | | 9/1998 |
| EP | 1 076358 | * | 2/2001 |
| JP | 08055838 | * | 8/1996 |
| JP | 11140675 | * | 5/1999 |
| JP | 2001093889 | * | 4/2001 |

* cited by examiner

*Primary Examiner*—Savitri Mulpuri
(74) *Attorney, Agent, or Firm*—Pearne & Gordon LLP

(57) ABSTRACT

A semi-conducting device has at least one layer doped with a doping agent and a layer of another type deposited on the doped layer in a single reaction chamber. An operation for avoiding the contamination of the other layer by the doping agent separates the steps of depositing each of the layers.

7 Claims, 1 Drawing Sheet

METHOD FOR PRODUCING SEMI-CONDUCTING DEVICES AND DEVICES OBTAINED WITH THIS METHOD

BACKGROUND OF THE INVENTION

The present invention relates in general to the domain of semiconductor films based on silicon technology. It concerns, more particularly, a method for producing silicon junctions, doped or not, which can be used, for example, in solar cells. It also concerns any other semi-conducting devices obtained by such a method.

Amorphous or microcrystalline silicon solar cells are made of multilayer systems where semiconducting material with certain electronical and physical properties is deposited, layer by layer, on a substrate.

The n-layers and p-layers are doped with other elements to achieve desired properties, such as electrical conductivity. More precisely:

p-doped layers have a surplus of positive charge carriers,
n-doped layers have a surplus of negative charge carriers, and
i layers are intrinsic.

Generally, boron is used as the doping agent of the p-layers and phosphor as the doping agent of the n-layers.

Silicon solar cells manufacturers use either single-chamber or multi-chamber reactors to produce commercial photovoltaic (PV) modules. Plasma deposition of silicon solar cells in a single-chamber reactor leads to considerable simplifications and reduced costs as compared to multi-chamber processes.

However, in a single chamber deposition process of a p-i-n solar cell, for example, the subsequent deposition of the i-layer on the p-layer may cause boron recycling from the reactor walls and from the deposited p-layer. As a result, boron will contaminate the i-layer at the critical p-i interface and thereby weaken the strength of the electrical field in the i-layer close to p-i interface. This provokes a less efficient carrier separation just in this zone and leads to a reduced collection efficiency in the solar cell and thereby to a deterioration of the cell performance.

For that reason, most silicon p-i-n solar cells modules are, at present, deposited using multi-chamber reactors. Boron cross-contamination by recycling is avoided by simply depositing the p-layer and the i-layer in different chambers. However, the higher investment in multi-chamber systems equipment becomes a drawback particularly in the field of solar cells where costs are a major issue.

Similar problems exist with n-i-p solar cells in which phosphor used to dope the n-layer contaminates the i-layer at the critical n-i interface.

Thus, an interesting solution would be to combine a low cost-single chamber reactor with a process scheme able to suppress the boron or phosphor cross-contamination.

Different treatments have been tested with encouraging results, but they still leave open the question of the light-induced degradation of these solar cells, they use expensive gases, they have long treatment durations or are incompatible with large area deposition in industrial reactors.

SUMMARY OF THE INVENTION

The object of the present invention is to provide a method for producing semiconductors with a particular application in solar cells, avoiding cross-contamination by doping agents and exempt of disadvantages above mentioned.

More precisely, in order to achieve these goals, the invention concerns a method for producing a semi-conducting device comprising at least a layer doped with a doping agent and a layer of another type deposited on said doped layer in a single reaction chamber. The deposition steps of said layers are separated by an operation for avoiding the contamination by the doping agent of said another layer.

Advantageously, the operation comprises a dosing of the reaction chamber with a compound able to react with the doping agent.

According to a first embodiment, the contamination avoiding operation comprises a dosing of the reaction chamber with a vapour or gas comprising water, methanol, isopropanol or another alcohol.

According to a second embodiment, the contamination avoiding operation comprises a dosing of the reaction chamber with a vapour or gas comprising ammonia, hydrazine or volatile organic amines.

The invention also concerns a semi-conducting device comprising at least a layer doped with a doping agent and a layer of another type deposited on said doped layer. The interface between said layers contains traces of oxygen or of nitrogen as a result of a treatment for avoiding the contamination of said another layer by the doping agent.

BRIEF DESCRIPTION OF THE DRAWINGS

Other characteristics of the invention will be shown in the description below, made with regard to the attached drawing, where.

DETAILED DESCRIPTION OF THE INVENTION

The following description is particularly related, as an example, to the production of a boron doped p-i-n junction, i.e. a semiconductor device comprising respective p, i and n layers successively deposited on a suitable substrate providing the base of a solar cell.

The three layers are deposited in a manner well known by a person skilled in the art but, according to the invention, the method comprises an important supplementary step.

Figure 1:
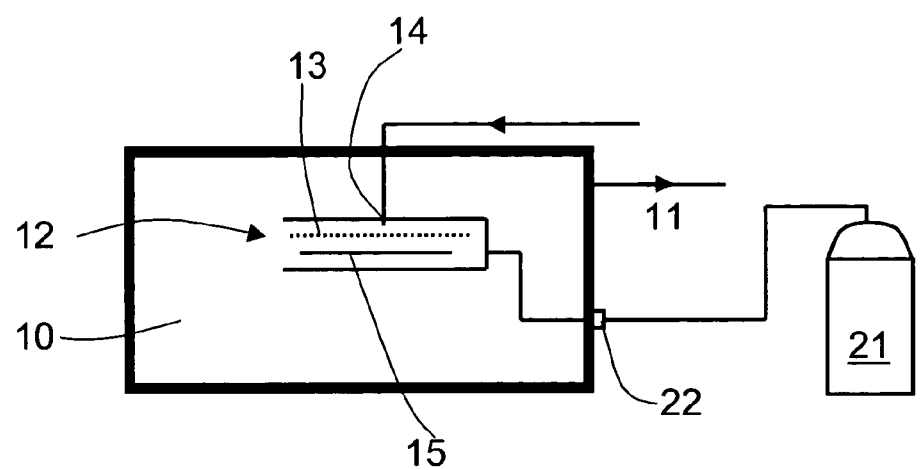
FIG. 1 shows the reactor used for the implementation of the method.

FIG. 1 shows the reactor used to produce such a semiconducting device. Basically, it comprises:

a vacuum chamber 10 connected to a vacuum circuit 11,
a hot wall inner chamber 12 disposed inside the vacuum chamber 10,
a radio-frequency-powered electrode 13 placed inside the inner chamber 12, and
a showerhead 14 incorporated within the electrode 13 and connected to different gas feeding lines to introduce appropriate reacting products.

A substrate 15, for example a glass/TCO substrate of the type Asahi U, based on $SnO_2$:F (glass coated with fluorine doped SnO2), is being arranged in the inner chamber 12.

The above described installation is preferably adapted from the industrial KAI™-S reactor of Unaxis Displays in order to constitute a Plasma Enhanced Chemical Vapour Deposition (PECVD) system. The typical dimensions of the inner chamber 12 are 50 cm width×60 cm length×2.5 cm height.

For the initial p-layer deposition on substrate 15, the reacting gas introduced in the reactor through the showerhead 14 are, typically:

to form the p-layer : silane, methane and hydrogen, and
to dope the layer with boron : trimethylboron (TMB).

TMB is particularly well suited, instead of diborane (commonly used) because it has a superior thermal stability in the hot reactor and is reported to cause less contamination.

To perform the deposition of the p-layer, the plasma excitation frequency used is e.g. 40.68 MHz, the temperature is 200° C., while the pressure is kept at 0.3 mbar, and the power RF is applied at a level of 60 W.

Many experiments have suggested that boron introduced in the reactor is not simply present in a gaseous state which could be easily pumped out, but might be physisorbed on the internal reactor surfaces and desorb very slowly after a pumping period.

Therefore, according to a first embodiment of the invention, after the deposition of the p-layer and before the deposition of the i-layer, the internal surfaces of the reactor and the substrate also are dosed with a vapour or a gas comprising water, methanol or isopropanol or another alcohol.

More precisely, in this example, the dosing product is stored in a separate bottle 21 connected, via a valve 22, to the vacuum chamber 10, which is kept at low pressure condition. When the valve 22 is opened, the dosing product starts boiling in the bottle 21 because of the low pressure inside and vapour flushes into the chamber 10. Of- course, the RF electrode 13 is off. The operation is performed between 100 and 350° C., typically at 200° C. and during less than 10 minutes, typically 2 minutes and at 0.05 to 100 mbar. The flow of water vapour has to be sufficient. For example, 90 mbar.sec is a good value. If methanol or isopropanol is used, the flow is generally higher.

After the dosing operation, a short pumping period of less than 5 minutes, typically around 3 minutes, under similar conditions but without any dosing gas addition, is advantageously respected before the deposition of the i-layer.

As a result of the above dosing operation, the boron which was physisorbed on all the internal surfaces of the reactor and of the substrate is transformed into stable chemical compounds unable to desorb. A contamination of the layer which will be later deposited on the p-layer is thus avoided.

After this treatment, the i-layer, then the n-layer are deposited in the same reactor. The conditions described above for the p-layer deposition are reused with appropriate reacting gases, as known by a person skilled in the art.

As an example, the reacting gases used for the deposition of the i-layer are a mix of 75% of silane and 25% of hydrogen, whereas the reacting gases used for the deposition of the n-layer are silane, hydrogen and phosphine.

The evaluation of the base level boron contamination of the i-layers can be made by Secondary Ion Mass Spectroscopy (SIMS) in order to trace the boron concentration depth profile across the p-i interface.

Figure 2:
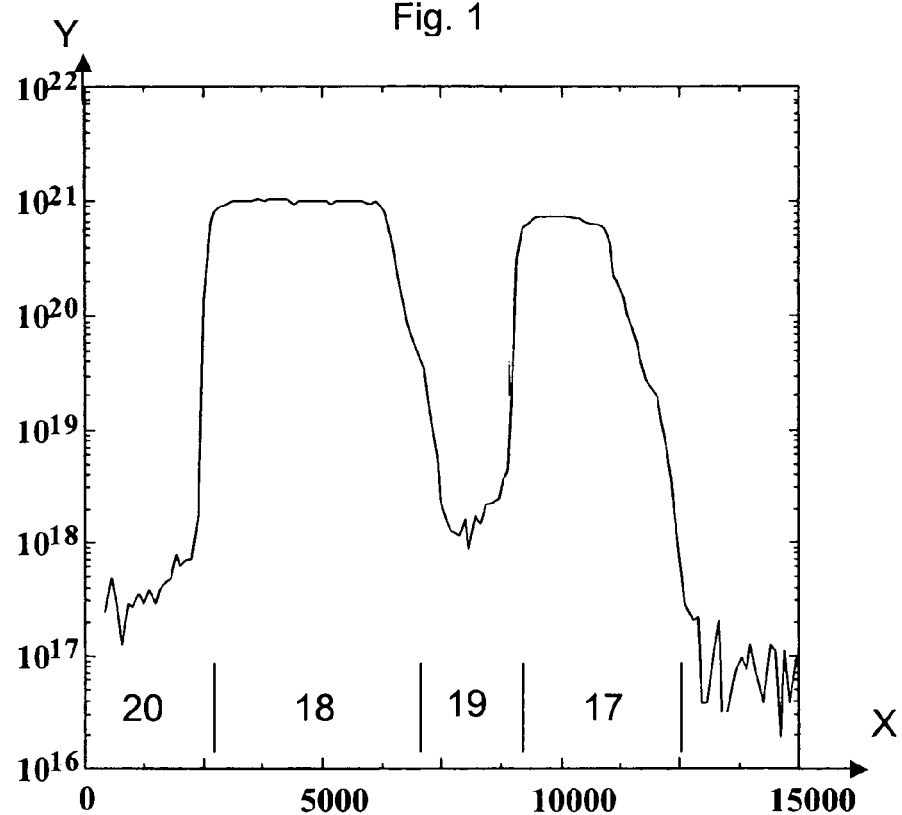
FIG. 2 illustrates the effect of the doping agent contamination avoiding operation.

To illustrate the efficiency of the above-described dosing treatment, FIG. 2 shows, as an example, the boron SIMS profile (depth X from surface in Angstroms versus boron concentration Y in atoms.cm$^{-3}$) of a p-i-p-i sandwich structure deposited on a c-Si wafer. Both p-doped portions 17 and 18 are normally deposited.

A first i-layer 19 is deposited on the p-layer 17 without performing any additional treatment. The base level contamination of boron measured in the i-layer 19 is about $10^{18}$ atoms.cm$^{-3}$.

A second i-layer 20 is deposited on the p-layer 18 portion after the dosing treatment as described above. The base level contamination of boron measured in the i-layer 20 is reduced to about $10^{17}$ atoms.cm$^{-3}$, which represents an improvement of one order of magnitude.

The boron contamination in the i-layer of a solar p-i-n cell treated according to the invention can also be indirectly detected by performing voltage dependent quantum efficiencies measurements as well as monitoring the global cell performance especially the fill factor of the solar cell. The results are substantially the same as those obtained with cells deposited in multi-chamber reactors.

Furthermore, an oxygen peak can be observed with a SIMS analysis at the treated p-i interface, meaning that the above described treatment has been used. Typically, the amount of oxygen in the peak is higher than $10^{19}$ atoms.cm$^{-3}$.

According to a second embodiment of the invention, after the deposition of the p-layer and before the deposition of the i-layer, the internal surfaces of the reactor are dosed with a vapour or gas comprising ammonia, hydrazine or volatile organic amines. This dosing operation is performed at low pressure conditions (0.05 to 100 mbar), between 100 and 350° C., typically at around 200° C. and during less than 10 minutes, typically around to 2 minutes. The flow of gas has to be sufficient. For example, 90 mbar.sec is a good value for ammonia. After the dosing operation, a short pumping period of less than 5 minutes is also respected before the deposition of the i-layer.

A nitrogen peak can be observed with a SIMS analysis at the treated n-i interface, meaning that such a treatment has been used. Typically, the amount of nitrogen is higher than $10^{19}$ atoms.cm$^{-3}$.

For both embodiments of the invention, it may be useful to depose on the p-layer, after the above described treatments, a hydrogen-diluted buffer layer. This layer is obtained by PECVD of a mix of 10% silane and 90% hydrogen. The plasma excitation frequency used is 40.68 MHz, the temperature is 200° C., while the pressure is kept at 0.5 mbar, and the power RF is applied at a level of 60 W. Such a layer alone has usually already a beneficial effect on the boron cross contamination in the i-layer.

The method of the invention, according to both described embodiments, offers the advantage to eliminate the boron contamination while working with a single reactor. There is neither wasted pumping time nor loss of time due to transfer of the substrate out of the reactor for a cleaning step nor loss of time for reheating of the substrate which cooled down during the transfer. Moreover, apart from simpler and faster processes the single chamber approach bears the potential of considerably simplified deposition systems as compared to multi-chamber systems. It has to be noted that such methods allow to produce a complete solar cell in only 30 minutes.

A person skilled in the art can easily adapt the above described treatments to a n-i-p solar cell in order to avoid phosphor cross-contamination after the deposition of n-doped layer.

Needless to say that the invention can also be applied to a any junction based on a p-doped or n-doped layer. The dosing can also be performed by injecting the dosing compound directly in the gas feeding line.

The invention claimed is:

1. A method for producing a semi-conducting device comprising at least a first plasma-deposited layer doped with a doping agent and a second plasma-deposited layer deposited on said first doped layer in a single reaction chamber, wherein the deposition steps of said first and second layers are separated by an operation for avoiding the contamination of said second layer by the doping agent, wherein said operation comprises a dosing of the reaction chamber, having said first doped layer therein, with a vapour or gas comprising ammonia, hydrazine or a volatile organic amine without plasma, wherein as result of said dosing, residual doping agent from the deposition of said first layer that is present on initial surface of said reaction chamber is transferred into stable chemical compounds unable to desorb.

2. The method of claim 1, wherein the doped layer is a p-doped layer.

3. The method of claim 1, wherein the doped layer is a n-doped layer.

4. The method of claim 2, wherein said operation is followed by the deposition of a buffer layer on the p-layer.

5. The method of claim 1, wherein said dosing is followed by a pumping at high vacuum and between 100 and 350° C. for less than 5 minutes.

6. The method of claim 1, wherein said dosing is performed at around 0.05 to 100 mbar and between 100 and 350° C. for less than 10 minutes.

7. The method of claim 1, wherein said doping agent comprises trimethylboron.

* * * * *